SEMICONDUCTOR CONTROLLED RECTIFIER WITH SPRING BIASED ELECTRODE CONTACTS

Filed March 21, 1963 2 Sheets-Sheet 1

3,293,510

SEMICONDUCTOR CONTROLLED RECTIFIER WITH SPRING BIASED ELECTRODE CONTACTS

Joachim Pfaffenberger and Heinz Martin, Munich, Germany, assignors to Siemens-Schuckertwerke Aktiengesellschaft, Berlin-Siemensstadt, Germany, a corporation of Germany Filed Mar. 21, 1963, Ser. No. 267,047
Claims priority, application Germany, Mar. 24, 1962, S 78,647
6 Claims. (Cl. 317—235)

Our invention relates to semiconductor controlled rectifiers and similar semiconductor devices of thyratron-type performance, having a four-layer p-n-p-n crystalline semiconductor body with two main electrodes on the respective outer (p-type and n-type) layers and a control electrode on one of the intermediate layers. In a more particular aspect, our invention relates to silicon controlled rectifiers and similar semiconductor devices that have one of the main electrodes located on one side of the semiconductor body and provided with a recess that extends inwardly from the perimeter of the electrode, the control electrode being located on the same side of the semiconductor body and partly extending into the just-mentioned recess from the marginal zone of the semiconductor surface, thus entering into the geometric main contour defined by the basic shape of the main electrode.

Such controllable semiconductor devices, aside from electrical advantages, are preferred for reasons of design and manufacture because the connecting leads from the main electrode and the adjacent control electrode can be made to extend in parallel relation toward the same side through an insulating insert or nipple of the housing or capsule containing such a semiconductor member, thus doing away with the need for mutually coaxial terminal conductor structures.

It is an object of our invention to improve controlled semiconductor devices generally of the above-mentioned type toward improved reliability and longer useful life under thermal stresses and also toward greatly simplifying the production and assembling work required in the manufacture of such devices, especially with respect to encapsulated types.

According to a feature of our invention, the connections, at least for the main electrode and the control electrodes that are located on the same side and surface of the semiconductor body are made and maintained without soldering by mutual pressure engagement permanently permitting a lateral gliding displacement between connecting means and electrodes in the event of differences in thermal expansion or contraction during operation of the device. The mutual contact areas of the connecting conductor and the respective electrodes of the semiconductor member are pressed together by sufficient force to obtain an only slight contact resistance between them. To produce and maintain such pressure, we preferably provide the device with force storing means such as pressure springs.

Only one pressure contact is needed for the main contact and only one additional pressure contact for the control electrode located at one and the same semiconductor surface. However, according to another feature of our invention, it is preferable, in semiconductor devices of relatively high power rating, to provide the main electrode with a plurality of individual contact pieces separately pressed against the electrode surface. According to a more specific feature, each of the individual contacts for the main electrode is provided with its own force storing member, such as a spring, which forces the contact against the main electrode. This has the advantage that a given minimum number of contact local advantage that a given minimum number of contact localities is secured between the connecting conductor and the main electrode of the semiconductor member, whereas a single pressure contact cooperating with the main electrode can reliably secure only a three-point engagement unless ductile layers are interposed between the mutually adjacent areas of the connecting conductor and the electrode.

The above-mentioned and more specific objects, advantages and features of our invention, said features being set forth with particularity in the claims annexed hereto, will be apparent from, and will be described in, the following with reference to the embodiments of controlled and encapsulated semiconductor devices according to the invention illustrated by way of example in the accompanying drawings, in which:

Figure 1:
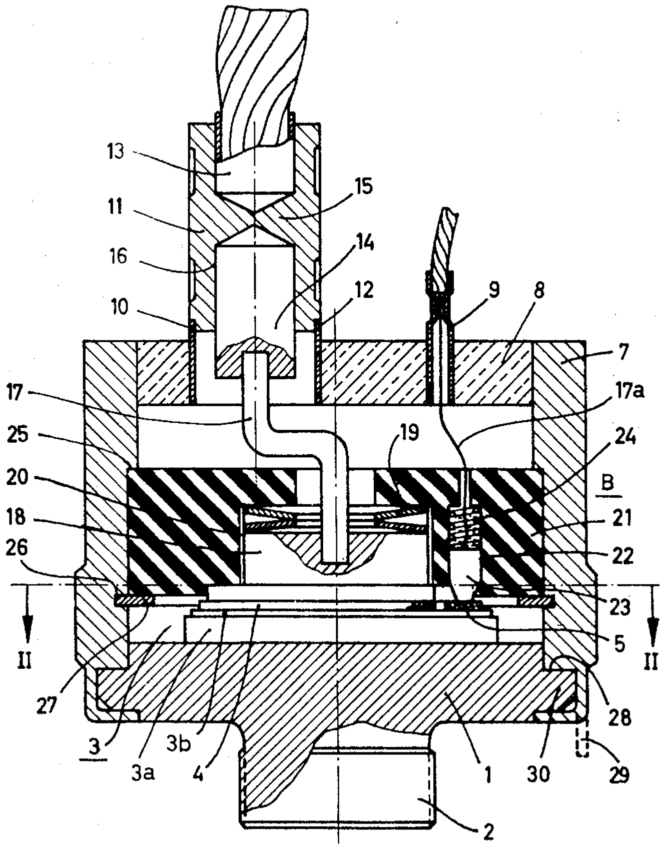
FIG. 1 is an axial section through a silicon controlled rectifier embodying features of the invention, the section being taken along the line I—I in FIG. 2.
Figure 2:
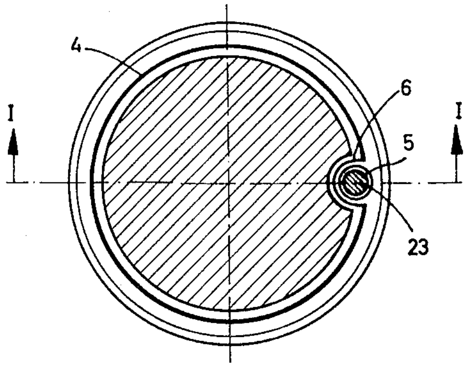
FIG. 2 is a plan view of the semiconductor member that forms part of the device shown in FIG. 1, the view being taken onto the plane denoted in FIG. 1 by II–II.

The device shown in FIGS. 1 and 2 comprises a capsule formed essentially of housing portions 1, 7 and 8. The housing portion 1 consists of copper and forms a heat sink. It is provided with an integral threaded stud 2 for attachment of the device to a bus bar. Mounted on the planar top surface of the housing portion 1 is the semiconductor member 3, whose main body **3*b* consists of p-type silicon of relatively low conductance. The bottom electrode, covering the lower face of the silicon disc 3*b* is alloyed together with a carrier plate 3*a* of molybdenum which in turn is soldered to the housing portion 1. The housing portion 1 thus constitutes one of the connecting poles for the electrode on the bottom face of the semiconductor body 3*b*. Provided on the top face of the flat semiconductor body 3*b* are the main electrode 4 and the control electrode 5. The main electrode 4 is of circular shape but has a marginal recess 6 in which most of the control electrode 5 is located. The main electrode 4** may be given different shapes but it generally circumscribes a simple geometric contour within whose confines much of the control electrode is located, as exemplified by the illustrated embodiment.

The upper portion of the housing form a single bell-shaped assembly B and cooperates with the plate-shaped bottom portion 1 to provide for a gas-tight sealing of the chamber in which the semiconductor element 3 is located. The bell-shaped portion B comprises a cylindrical portion of metal 7 and a disc-shaped top plate 8 of insulating material preferably glass. The plate 8 carries two sleeves 9 and 10 of metal. The relative dimensions of the metallic components 9, 10 and 7 with respect to the mass of the glass plate 8 are such that when the body of the glass plate 8 solidifies from the molten state, in contact with the metal components, these components are placed under sufficient pressure that during the subsequent heating occurring in the operation of the semiconductor device, no tensional stresses can ever occur in the glass plate 8 that may result in the formation of fissures in the insulating in-lead structure formed by the cover plate 8 and the metal sleeves joined therewith. A metallic body 11, forming a peripheral shoulder at 12, is inserted into the upper portion of the metal sleeve 10 and is hard-soldered thereto. The metal body 11 has two axial bores 13 and 14 which do not communicate with each other and penetrate into the body down to such a depth as to leave a partition at 15. The bore 14 thus constitutes a cup facing the inner space of the housing. A connecting body 16 is inserted into the bore 14, and a connecting conductor 17 for the main electrode contact 18 is fastened to the body 16.

The main electrode contact 18 is actuated by disc springs 19 and is guided in a bore 20 of an insulating member 21. Another bore 22 of member 21 serves for guiding a contact 23 and for receiving a force storer 24 consisting of a helical spring which acts upon the contact 23. The cylindrical portion 7 of the housing forms an internal peripheral shoulder 25 which keeps the insulating member 21 in proper position. In order to make certain that the insulating carrier member 21 occupies a given position within housing portion 7 before the two housing portions 1 and 7 are joined together, the inner peripheral surface of portion 7 is provided with an annular groove 26 in which a spring ring 27 is seated. The lower rim of the housing portion 7 forms a shoulder 28 from which a cylindrical portion 29 of reduced wall thickness protrudes downwardly. Before the housing portions 1 and 7 are joined together, the cylindrical portion 29 extends as shown by broken lines in FIG. 1. During joining operation the protruding portion 29 is snugly adjacent to the radially protruding shoulder 30 of the housing bottom portion 1. After the two housing portions 7 and 1 are placed together, the downwardly protruding end 29 of portion 7 is deformed about the shoulder 30, thus firmly joining the two parts together. If desired, the housing portion 7 may be made of a mechanically stronger material than the shoulder 30 so that the shoulder 30 is effectively clamped between a mechanically more stable material.

In the embodiment according to FIG. 1, the contacts 18 and 23 are so loosely guided in the insulating carrier member 21 that they would drop out if they were not in abutment with the respective electrodes of the semiconductor member 3. In order to prevent this during assembly of the device, the following procedure is effective. The bell-shaped housing assembly B is placed upside down so that it constitutes an upwardly open cup. The semiconductor member 3 together with the base portion 1 of the housing is then inserted from above into the cup. Thereafter the two housing portions are joined together by deforming the protruding end 29 of the cylindrical housing portion 7 as described above.

It will be apparent that no difficulty is encountered in passing the connecting conductor 17 and 17*a* from the respective contacts 18 and 23 to the appertaining conductors, and that the contact localities are individually accessible to inspection as long as the housing is not yet fully assembled and closed.

However, a further improvement in this respect is afforded by not connecting the insulating carrier member 21 and the pressure contacts 18, 23 with the bell-shaped housing portion B, but rather with a support or with guide rods fastened to the base portion 1 of the housing. Then the semconductor member inclusive of its connecting contacts can be completed and inspected before the bell-shaped housing portion B is brought together with the base portion 1 and the parts attached thereto. Only then need the connecting conductors 17 and 17*a* inserted into or through the in-lead sleeves be fastened and gastightly sealed thereto.

The assembling can also be facilitated by guiding the pressure contacts 18 and 23 in their respective seats within the insulating carrier member 21 in such a manner that they cannot move beyond a given limit out of the bores toward the electrodes.

Figures 3, 4, 5:
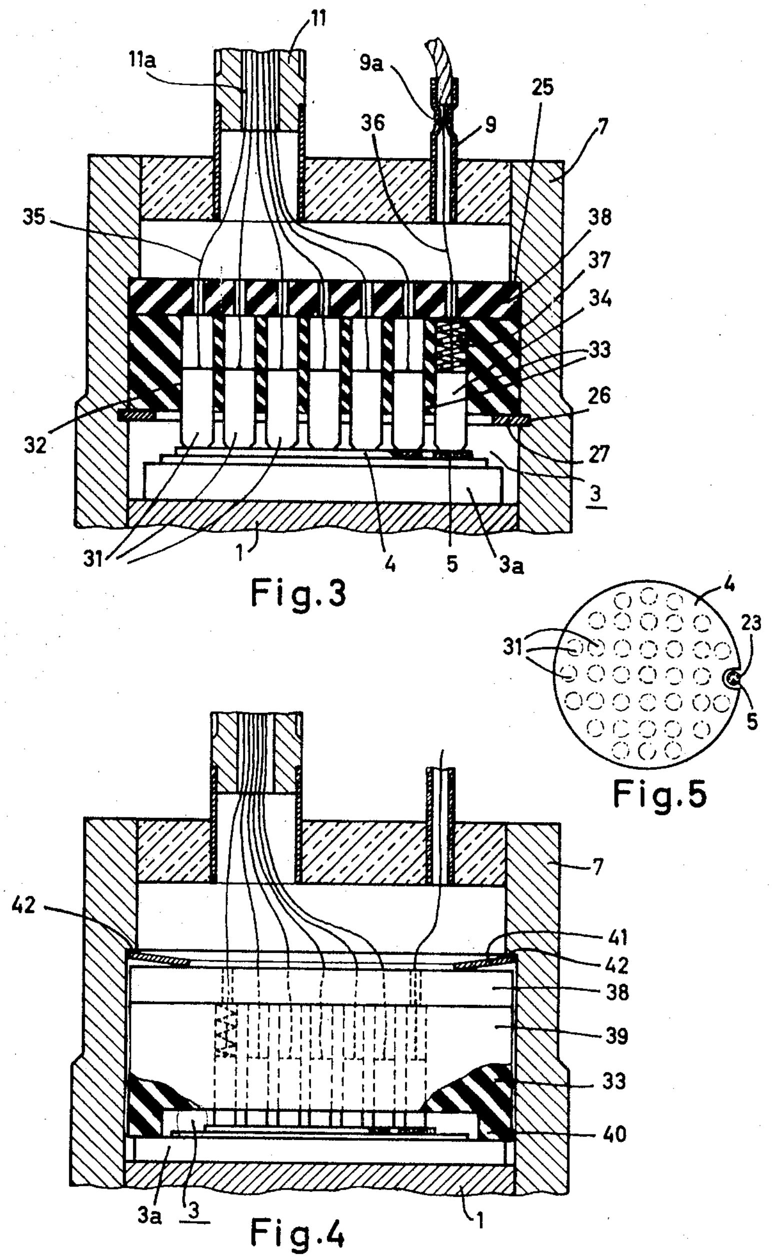
FIG. 3 shows partially an axial section of another semiconductor controlled rectifier embodying features of the invention.
FIG. 4 is a partial sectional view of still another semiconductor controlled rectifier embodying features of the invention.
FIG. 5 is a top view of a semiconductor member as contained in the devices according to FIGS. 3 and 4.

The embodiment illustrated in FIGS. 3 and 5 differs from that of FIGS. 1 and 2 by comprising a multiplicity of individual pressure contacts 31 between the main electrode and the appertaining main conductor. The respective pressure contacts 31 are axially displaceable in channels 32 of the insulating carrier member 33. The single pressure contact 34 cooperating with the control electrode is designed in substantially the same manner as the individual pressure contacts 31 for the main electrode 4. Fastened to the top end of each individual contact 31, 34 is a wire 35, 36. The wires 35 for the main-electrode contacts 31 are combined to form a single conductor which, similar to the embodiment of FIG. 1, is inserted into a cup-shaped sleeve 11 and fastened therein by pressing, soldering or welding, at the location 11*a*. The connecting wire 36 for the control electrode passes through the sleeve 9 of the insulated in-lead and is fastened therein by compression at the locality 9*a*.

A helical pressure spring 37 acts upon the top end of each pressure contact 31, 34. The other end of each spring rests against the top end of the individual channel 32. Placed upon the insulating carrier member 33 is a plate 38 of insulating material which forms the top ends of the insulating carrier member 33 as well as corresponding openings for the passage of the flexible wires 35 and 36. The insulating carrier structure for the individual contacts is thus composed of the two parts 33 and 38 which, if desired, may be mechanically connected with each other to form a unit containing the individual pressure contacts 31 and 34. This unit or subassembly is inserted into the bell-shaped housing portion up to the shoulder 25. No further holding means are necessary. However, it is preferable to secure the insulating carrier in position by means of a spring ring 27 inserted in a recess 26 as described above with reference to FIG. 1.

If desired, the individual pressure contracts 31 and 34 may be guided in their respective bores so that they can move only a given distance in the direction toward the semiconductor member, and so that the front faces of the pressure contacts are substantially in a predetermined plane before the two housing portions and hence the pressure contacts and the electrodes of the semiconductor member 3 are brought together. Such limitation of the contact motion is effected according to one embodiment by providing the top faces of the individual contacts with sleeve-shaped parts which extend through the openings in the insulating top plate 38 and whose uppermost ends are bent laterally. These ends then form respective stops which abut against the plate 38 as long as the bell-shaped housing portion is not assembled with the housing base portion and the individual pressure contacts are not yet in engagement with the semiconductor electrodes. Such sleeve-shaped extensions of the pressure contacts then also form a guiding sleeve for the helical pressure spring, which sleeve surrounds the connecting wire of the individual contacts.

The semiconductor member 3 in the embodiment of FIG. 3 is fastened to the base portion 1 of the housing. This can be done by means of soft solder, hard soldering or alloying.

In the embodiment shown in FIG. 4, in which identical components are identified by the same respective reference characters as in the preceding illustrations, the semiconductor member 3 is not fusion-joined with the housing base portion 1 but is mechanically forced against it by means of the bell-shaped housing portion. That is, under the pressure forces that establish and maintain contact engagement between the connecting conductors and the semiconductor electrodes, the semiconductor member 3, or the molybdenum carrier plate 3*a* that forms part of the member, is simultaneously pressed against the heat sink and produces a glidable mutual engagement. The glide surfaces are preferably such that the respective materials do no have the tendency to enter into a mutual bond of the fusion type, similar to soldering, welding or alloying, under the pressure exerted by the pressure contacts and the temperatures occurring in the operation of the semiconductor device.

For reliably obtaining the desired glide contact between semiconductor member and heat sink, the insulating carrier body 33 according to FIG. 4 has a downwardly protruding peripheral portion 40 placed against a marginal zone of the semiconductor member 3 or, as shown, against the carrier plate *3a* which forms part of the semiconductor member for mechanically stabilizing and stiffening it. The semiconductor body proper is located in the space within the protruding portion 40 of the insulating carrier body 33. The contact engagement between the pressure contacts on the one hand and the main electrode and control electrode on the other hand takes place in the same space. The electric contact resistance between the semiconductor member and the heat sink should be as small as possible, and the thermal transfer resistance should likewise be a minimum. Sufficient force must therefore be available for pressing the semiconductor member 3 against the housing bottom portion 1. For that reason, the embodiment according to FIG. 4 is provided with an additional force storer consisting of a ring-shaped spring 42 which acts through the insulating top plate 38 upon the carrier member 39. If desired, a plurality of such disc- or ring-type springs may be used. The spring 41 rests against a shoulder 42 of the housing portion 7, this shoulder corresponding to the one denoted by 25 in FIG. 3. In all other respects the embodiment of FIG. 4 corresponds to the one described above with reference to FIGS. 3 and 5.

Thus the fundamental structure of the semiconductor device according to the invention is achieved in a relatively simple manner by employing a carrier or guide body jointly for the one or more connecting contacts of the main electrode and the connecting contact of the control electrode. As a result, a simple spatial arrangement of the contacts and electrode surfaces at the semiconductor member is obtained, which facilitates assembling the device during its manufacture, as well as installing the device in circuitry or subsequently tracing the circuit connections. Insertion of this carrier for the pressure contacts during assembling of the device is effected by separately combining these contacts with a housing portion that is subsequently to be joined and gas-tightly sealed together with another housing portion, for example by welding, to form then a unitary housing structure or capsule. In this manner, the one housing portion, including its insulating insert or nipple for the connecting conductors, can be completed by itself, and the semiconductor member proper can be assembled with the other housing portion and can be joined permanently or removably, before the two housing portions with their respective contents are joined and attached together. The insertion of the contact carrier system is effected simply by inserting the carrier into the hollow space of the one housing portion and then preferably fixing or latching the carrier in a suitable position.

The same carrier is also used for attaching or clamping the semiconductor member to the other housing portion. This is preferably done by providing a specially inserted force storing means such as a spring. The carrier for the pressure contacts may consist of several parts of which one has channels and is partially closed at one or both sides by cover plates which close the channels. In this manner a simple mounting of the individual pressure contacts for the main-electrode conductor and for the control-electrode conductor is obtained. In this case the individual pressure contacts already may be subject to a pre-stressed force storer in their carrier, particularly if the individual contacts are guided in the carrier so that the guiding means provide for a definite limit position of the individual contacts in protruding position and that the end faces of the individual contacts are already held, at least approximately, in a predetermined plane. When these end faces are thereafter pressed against the electrode surfaces of the semiconductor member, the force storers acting upon the individual pressure contacts are stressed a further amount corresponding to the desired contact pressure between the individual contacts and the respective electrodes of the semiconductor body.

If a multiplicity of individual pressure contacts is used for the main electrode, then the respective individual connecting wires are combined outside of the contact carrier, for example by twisting, to form a single conductor which passes through the insulated insert or nipple where it is fastened for example by pressure and/or soldering or welding. The inner portion of the insulated in-lead, through which the main conductor passes, is preferably cup-shaped and is soldered or welded at a marginal or peripheral zone of the cup with the inner metallic sleeve of the insulated in-lead, so that this junction point is the only one which must be made gas-tight in order to gas-tightly seal the housing portion in which the insulated in-lead is located.

While the embodiments described in the foregoing with reference to the drawings are provided with a single control electrode, the invention is analogously applicable to devices equipped with a plurality of control electrodes located at the same surface side of the semiconductor member where one of its main electrodes is located.

Such and other modifications will be obvious to those skilled in the art, upon a study of this disclosure, and within the scope of the claims annexed hereto.

We claim:

1. A controllable semiconductor device, comprising a housing having a bottom portion and a generally bell-shaped top portion peripherally joined and sealed to each other, the top portion of said housing having an inner peripheral shoulder, a substantially flat semiconductor body having respective main electrodes on top and bottom surfaces and a control electrode on one of said surfaces adjacent to and in spaced relation with one of said main electrodes, said semiconductor body being mounted in said housing in contact engagement with the bottom portion of said housing, said one of said main electrodes and said control electrode facing away from the bottom portion of said housing, two conductor means for said one of said main electrodes and said control electrode respectively, said conductor means being spaced from each other, pressure contact means having an insulating carrier structure and mutually insulated contact members on said structure, said insulating carrier structure being mounted in the top portion of said housing and secured in a given position relative thereto for abutment against the inner peripheral shoulder of said top portion of said housing, spring means urging said contact members toward said respective electrodes, said contact members providing abutment of said respective conductor means with said one of said main electrodes and said control electrode respectively and forming respective glide contacts therewith, and latching means affixed to the top portion of said housing for holding said insulating carrier structure in said position.

2. A controllable semiconductor device, comprising a housing having a bottom portion and a generally bell-shaped top portion peripherally joined and sealed to each other, a substantially flat semiconductor body having respective main electrodes on top and bottom surfaces and a control electrode on one of said surfaces adjacent to and in spaced relation with one of said main electrodes, said semiconductor body being mounted in said housing in contact engagement with the bottom portion of said housing, said one of said main electrodes and said control electrode facing away from the bottom portion of said housing, two conductor means for said one of said main electrodes and said control electrode respectively, said conductor means being spaced from each other, pressure contact means having an insulating carrier structure and mutually insulated contact members on said structure and mutually insulated contact members on said structure, said insulating carrier structure being mounted in the top portion of said housing and engaging said semiconductor body, and pressure spring means disposed in said housing and engaging said insulating carrier structure for causing it to press said semiconductor body against the bottom portion of said housing.

3. A controllable semiconductor device, comprising a substantially flat semiconductor body having respective main electrodes on top and bottom surfaces and a control electrode on one of said surfaces adjacent to and in spaced relation with one of said main electrodes, respective conductor means for said one main electrode and said control electrode, said conductor means being spaced from each other, an insulating carrier structure integral in form having a plurality of channels spaced from each other and each having an aperture of reduced diameter, mutually insulated pressure members displaceable in said channels in directions toward said one main electrode and said control electrode, and spring means disposed in said respective channels and engaging said pressure members for urging them in said directions, the reduced diameter apertures of said channels coacting as stop limiting means for the respective spring means, said pressure members being electrically connected with said conductor means and in pressure engagement with said respective electrodes to form mechanical glide contacts therewith.

4. A controllable semiconductor device as claimed in claim 3, wherein said spring means for said pressure member of said main electrode comprises a disc-type spring coaxially mounted in the appertaining channel behind said pressure member.

5. A controllable semiconductor device, comprising a semiconductor body having an electrode surface, main electrode means and a control electrode bonded with said body, said main electrode means having a main electrode member substantially circumscribing a geometric main contour on said surface, said control electrode being located substantially within said contour, two terminal conductors for said main electrode and said control electrode respectively, pressure contact means electrically connecting said conductors with said respective main and contact electrodes and forming glidable contact engagements with said two electrodes, said pressure contact means comprising a pressure member displaceable toward and into engagement with said control electrode and a number of individual pressure members independently displaceable toward and into engagement with a number of respective points of said main electrode, each of said pressure members having a direction of displacement parallel to those of said other pressure members, pressure springs individually engaging said respective pressure members for forcing them toward said main and control electrodes, connecting leads attached to said respective pressure members, said lead of said pressure member for said control electrode being connected to one of said two conductors, said leads of all of said pressure members for said main electrode being connected to said other conductor, a housing which encloses said semiconductor member and said pressure contact means, said housing having two insulated and sealed lead-in means joined with said respective two conductors.

6. A controllable semiconductor device as claimed in claim 5, wherein the said lead-in means of said housing comprises a cup-shaped conductor body having a cup space, said housing having an insulating portion tightly joined to said body with the cup space of said body open to the interior of said housing, at least one of said leads extending into said cup space and being attached therein to said body.

References Cited by the Examiner

UNITED STATES PATENTS

| | | | |
|---|---|---|---|
| 3,160,800 | 12/1964 | Smart | 317—235 |
| 3,192,454 | 6/1965 | Rosenheinrich et al. | 317—234 |

JOHN W. HUCKERT, *Primary Examiner.*

R. F. POLISSACK, *Assistant Examiner.*